US008893065B2

(12) United States Patent
Agarwala et al.

(10) Patent No.: US 8,893,065 B2
(45) Date of Patent: Nov. 18, 2014

(54) BIOMETRIC MARKERS IN A DEBUGGING ENVIRONMENT

(71) Applicant: Mentor Graphics Corporation, Wilsonville, OR (US)

(72) Inventors: Badruddin Agarwala, Pleasanton, CA (US); Tarak Parikh, San Jose, CA (US); Vivek Bhat, San Jose, CA (US); Neeraj Joshi, Fremont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/940,082

(22) Filed: Jul. 11, 2013

(65) Prior Publication Data

US 2014/0019924 A1 Jan. 16, 2014

Related U.S. Application Data

(60) Provisional application No. 61/670,511, filed on Jul. 11, 2012.

(51) Int. Cl.
G06F 17/50 (2006.01)

(52) U.S. Cl.
CPC ........ *G06F 17/5045* (2013.01); *G06F 17/5022* (2013.01); *G06F 17/504* (2013.01)
USPC .............. 716/106; 716/136; 716/139; 703/13

(58) Field of Classification Search
None
See application file for complete search history.

(56) References Cited

U.S. PATENT DOCUMENTS

| 5,371,851 | A | * | 12/1994 | Pieper et al. | 345/501 |
|---|---|---|---|---|---|
| 5,838,949 | A | * | 11/1998 | Hassoun | 703/13 |
| 5,920,711 | A | | 7/1999 | Seawright et al. | |
| 5,991,533 | A | * | 11/1999 | Sano et al. | 703/28 |
| 6,295,623 | B1 | * | 9/2001 | Lesmeister et al. | 714/741 |
| 6,691,301 | B2 | * | 2/2004 | Bowen | 717/114 |
| 7,051,299 | B2 | * | 5/2006 | Chadha et al. | 716/106 |
| 7,079,997 | B1 | * | 7/2006 | Hsu et al. | 703/14 |
| 7,137,078 | B2 | * | 11/2006 | Singhal et al. | 716/102 |
| 7,231,337 | B1 | * | 6/2007 | Karchmer et al. | 703/15 |
| 7,263,674 | B2 | * | 8/2007 | Lorenz | 716/102 |
| 7,613,599 | B2 | * | 11/2009 | Bade et al. | 703/14 |
| 7,725,276 | B2 | * | 5/2010 | Kimishima | 702/66 |
| 7,761,834 | B2 | * | 7/2010 | McConaghy et al. | 716/132 |
| 7,774,172 | B1 | * | 8/2010 | Yunt et al. | 703/2 |
| 7,823,097 | B2 | * | 10/2010 | Drasny et al. | 716/136 |
| 8,051,402 | B2 | | 11/2011 | Snell | |
| 8,082,141 | B2 | * | 12/2011 | Hodgson et al. | 703/21 |
| 8,126,691 | B2 | * | 2/2012 | Ciolfi et al. | 703/13 |
| 8,140,315 | B2 | | 3/2012 | Walter et al. | |
| 8,176,453 | B2 | * | 5/2012 | Yang et al. | 716/106 |
| 8,255,198 | B2 | | 8/2012 | Krishnaswamy et al. | |
| 8,365,110 | B2 | * | 1/2013 | Chang et al. | 716/106 |
| 8,365,132 | B2 | * | 1/2013 | Hsu et al. | 716/133 |
| 8,386,208 | B2 | * | 2/2013 | Cake et al. | 702/123 |
| 8,473,269 | B1 | * | 6/2013 | Ou et al. | 703/14 |
| 8,479,132 | B2 | * | 7/2013 | Tsai et al. | 716/111 |

(Continued)

*Primary Examiner* — Leigh Garbowski

(57) ABSTRACT

This application discloses a debug tool to prompting display of at least a portion of a simulated output for a circuit design in a debug window, identifying a marker corresponding to a value in the simulated output has been specified for the debug environment, and prompting accentuation of one or more occurrences of the value in the debug window relative to other values in the simulated output based, at least in part, on the marker specified for the debug environment.

17 Claims, 9 Drawing Sheets

(56) References Cited

U.S. PATENT DOCUMENTS

| | | | |
|---|---|---|---|
| 8,560,893 B1 | 10/2013 | Hollander et al. | |
| 8,560,985 B1 | 10/2013 | Sahu et al. | |
| 8,626,481 B1 * | 1/2014 | Sundararajan et al. | 703/14 |
| 8,630,824 B1 * | 1/2014 | Ip et al. | 703/2 |
| 8,731,894 B1 * | 5/2014 | Kranen et al. | 703/14 |
| 2002/0194543 A1 * | 12/2002 | Veenstra et al. | 714/39 |
| 2005/0010880 A1 * | 1/2005 | Schubert et al. | 716/4 |
| 2005/0091026 A1 * | 4/2005 | Hodgson et al. | 703/22 |
| 2006/0080626 A1 * | 4/2006 | Ohba et al. | 716/6 |
| 2006/0178863 A1 * | 8/2006 | Andersch et al. | 703/14 |
| 2006/0271345 A1 * | 11/2006 | Kasuya | 703/14 |
| 2007/0226542 A1 | 9/2007 | Beeston et al. | |
| 2007/0294651 A1 * | 12/2007 | Tsai et al. | 716/5 |
| 2008/0147372 A1 * | 6/2008 | Paulsen | 703/14 |
| 2008/0162104 A1 * | 7/2008 | Onishi et al. | 703/13 |
| 2009/0037163 A1 * | 2/2009 | Kong et al. | 703/21 |
| 2009/0055153 A1 * | 2/2009 | Bell et al. | 703/21 |
| 2009/0083683 A1 | 3/2009 | Snell | |
| 2009/0112554 A1 | 4/2009 | Walter et al. | |
| 2009/0171648 A1 * | 7/2009 | Watanabe | 703/21 |
| 2009/0199163 A1 * | 8/2009 | Soroker et al. | 717/128 |
| 2011/0238397 A1 * | 9/2011 | Chen et al. | 703/13 |
| 2011/0320991 A1 * | 12/2011 | Hsu et al. | 716/103 |
| 2012/0240022 A1 | 9/2012 | Bakshi | |
| 2013/0124184 A1 * | 5/2013 | Sakaguchi et al. | 703/22 |

* cited by examiner

BIOMETRIC MARKERS IN A DEBUGGING ENVIRONMENT

RELATED APPLICATION

This application claims benefit of and priority to U.S. Provisional Patent Application No. 61/670,511, filed Jul. 11, 2012, which is incorporated by reference herein.

TECHNICAL FIELD

This application is generally related to electronic design automation and, more specifically, to biometric markers in a debugging environment

BACKGROUND

Microdevices, such as integrated microcircuits and microelectromechanical systems (MEMS), are used in a variety of products, from automobiles to microwaves to personal computers. Designing and fabricating microdevices typically involves many steps, known as a "design flow." The particular steps of a design flow often are dependent upon the type of microcircuit, its complexity, the design team, and the microdevice fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows for integrated microcircuits. Initially, the specification for a new circuit is transformed into a logical design, sometimes referred to as a register transfer level (RTL) description of the circuit. With this logical design, the circuit can be described in terms of both the exchange of signals between hardware registers and the logical operations that can be performed on those signals. The logical design typically employs a Hardware Design Language (HDL), such as the Very high speed integrated circuit Hardware Design Language (VHDL). As part of the creation of a logical design, a designer will also implement a place-and-route process to determine the placement of the various portions of the circuit, along with an initial routing of interconnections between those portions. The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices, such as transistors, resistors, and capacitors, which will be used in the circuit, along with their interconnections. This device design generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the desired functions. This analysis is sometimes referred to as "formal verification."

Once the relationships between circuit devices have been established, the design can be again transformed, this time into a physical design that describes specific geometric elements. This type of design often is referred to as a "layout" design. The geometric elements, which typically are polygons, define the shapes that will be created in various materials to manufacture the circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Typically, a designer will perform a number of analyses on the resulting layout design data. For example, with integrated circuits, the layout design may be analyzed to confirm that it accurately represents the circuit devices and their relationships as described in the device design. The layout design also may be analyzed to confirm that it complies with various design requirements, such as minimum spacings between geometric elements. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes, that modify the layout design data to improve the usable resolution of the reticle or mask created from the design in a photolithographic manufacturing process.

After the layout design has been finalized, it is converted into a format that can be employed by a mask or reticle writing tool to create a mask or reticle for use in a photolithographic manufacturing process. The written masks or reticles then can be used in a photolithographic process to expose selected areas of a wafer to light or other radiation in order to produce the desired integrated microdevice structures on the wafer.

Returning to "functional verification," this type of analysis begins with a circuit design coded at a register transfer level (RTL), which can be simulated by a design verification tool. A designer, for example, utilizing the design verification tool, can generate a test bench that, when input to the simulated circuit design, can allow the design verification tool to analyze the functionality of the simulated circuit design. When the simulated circuit design operates differently than expected in response to the test bench, the designer can attempt to debug the circuit design, for example, to determine which of the gates in the circuit design is incorrectly configured, resulting in the generation of illegal states or transitions.

The design verification tool can record signal states and transitions of the circuit design, often called waveform data, which the designer can review in an attempt to identify a "bug" in the circuit design. The designer typically can utilize a debug tool to review the recorded waveforms, often alongside a source code of the circuit design, in an attempt to locate the illegal states or transitions. Once the designer locates the illegal states or transitions, for example, by identifying an incorrect output or value stored in a register of the circuit design, the designer can recursively review the recorded waveforms to identify the "bug" in the circuit design. For example, the designer can review input signals to the register for one or more previous clock cycles to determine when and how the incorrect value arrived at the register. While this technique can allow the designer to manually re-trace the path from the incorrect value or output to the "bug" in the circuit design, the process is often tedious, requiring designers to review thousands of clock cycles worth of waveform data having, in some cases, billions of different states or transitions to identify the circuit design or test bench failures.

SUMMARY

This application discloses tools and mechanisms for simulating a circuit design with a test bench, performing functional verification on the simulated circuit design, and, when functional verification fails, initiating a debug process to rectify the failure discovered functional verification. In some embodiments, a debug tool can prompt display of at least a portion of a simulated output for a circuit design in a debug window, identify a marker corresponding to a value in the simulated output has been specified for a debug environment, and prompt accentuation of one or more occurrences of the value in the debug window relative to other values in the simulated output based, at least in part, on the marker specified for the debug environment.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
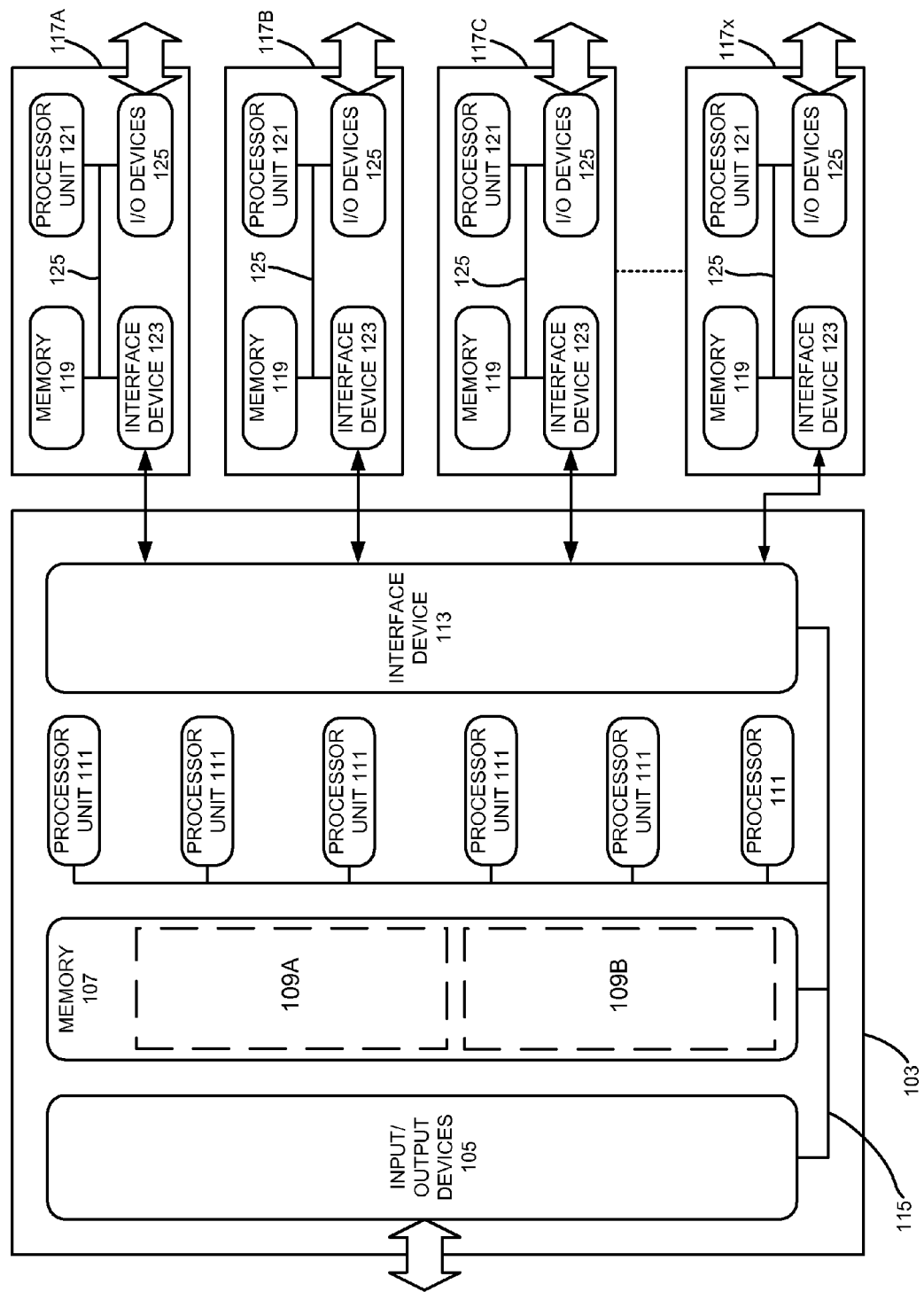
FIGS. 1 and 2 illustrate an example of a computer system of the type that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
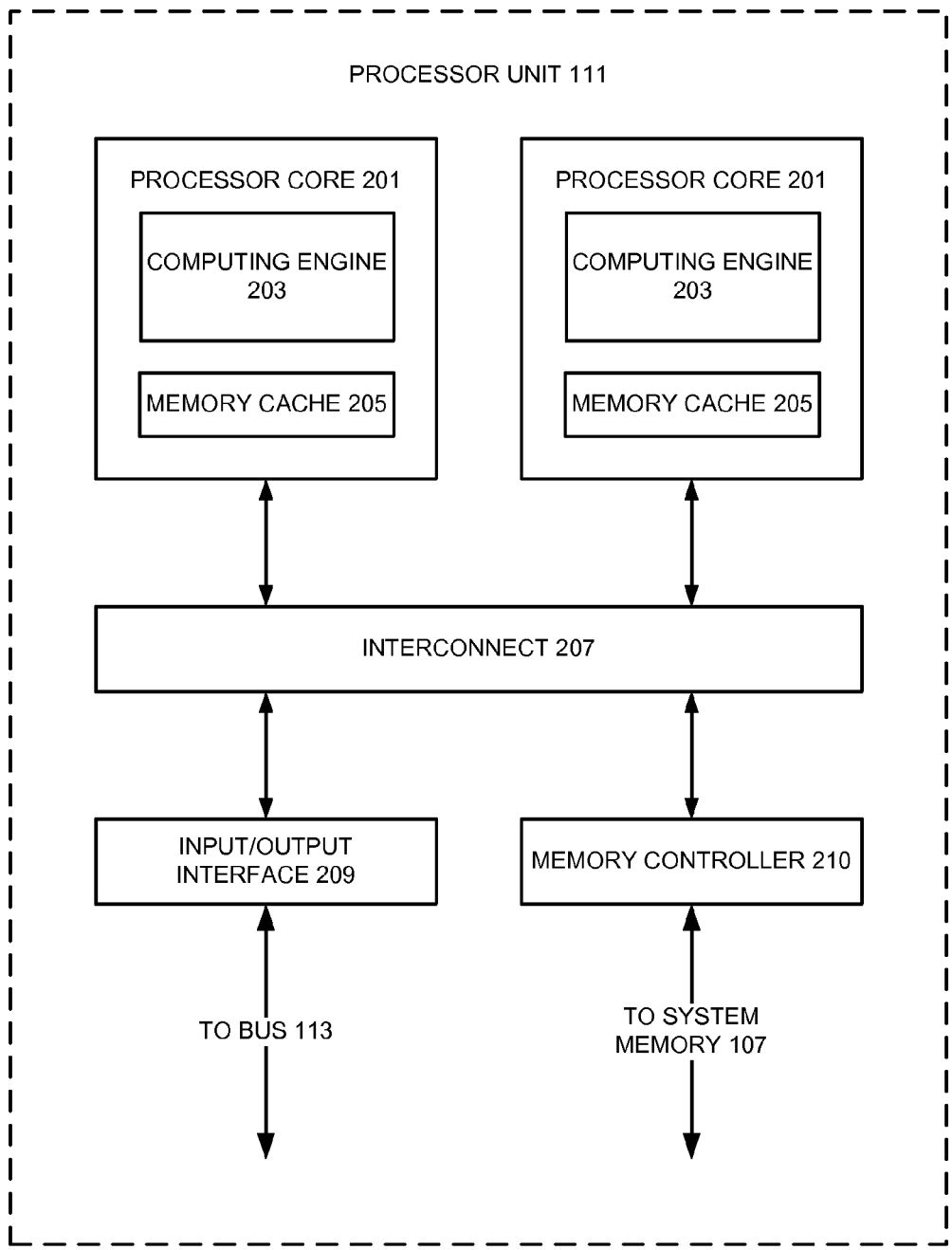

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Debug Tool with Marker-Based Value Accentuation

Figure 3:
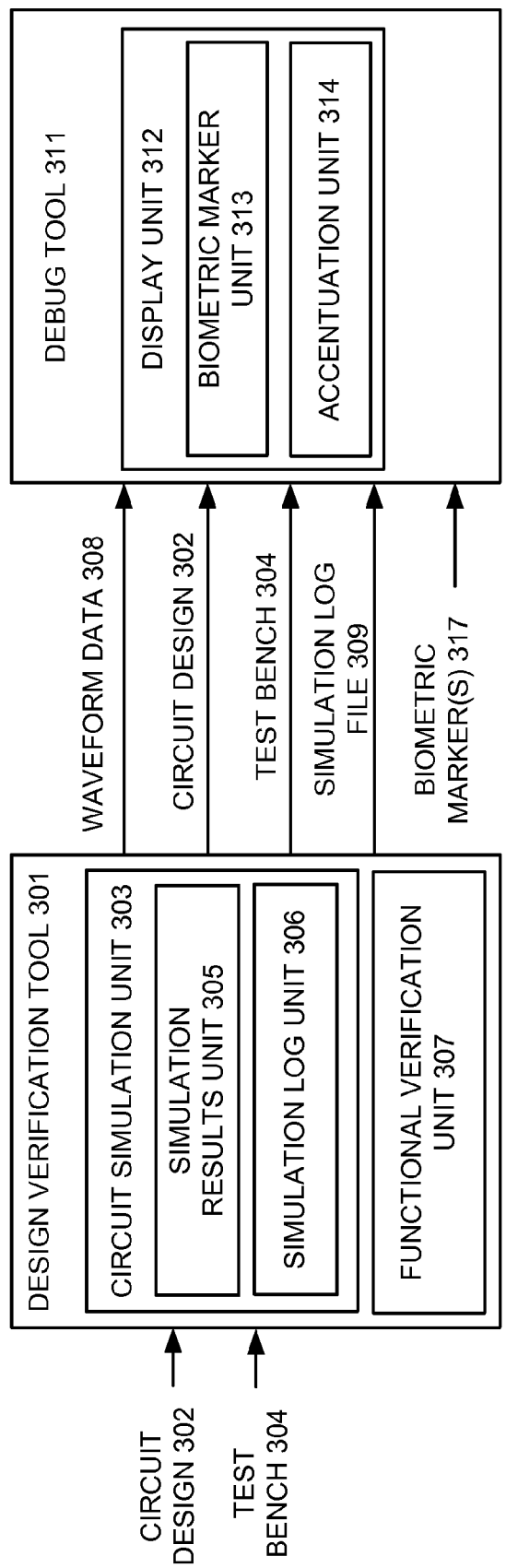
FIG. 3 illustrates an example system including a design verification tool and a debug tool that may be implemented according to various embodiments of the invention.

FIG. 3 illustrates an example system including a design verification tool 301 and a debug tool 311 that may be implemented according to various embodiments of the invention. Although FIG. 3 shows the design verification tool 301 separate from the debug tool 311, in some embodiments, the design verification tool 301 and the debug tool 311 can be integrated into a common tool. Referring to FIG. 3, the design verification tool 301 can receive a circuit design 302, which can describe an electronic device both in terms of an exchange of data signals between components in the electronic device, such as hardware registers, flip-flops, combinational logic, or the like, and in terms of logical operations that can be performed on the data signals in the electronic device. The circuit design 302 can model the electronic device at a register transfer level (RTL), for example, with code in a hardware description language (HDL), such as Verilog, Very high speed integrated circuit Hardware Design Language (VHDL), or the like.

The design verification tool 301 can include a circuit simulation unit 303 to simulate the circuit design 302 based, at least in part, on a test bench 304. The test bench 304 can define test stimuli, for example, clock signals, activation signals, power signals, control signals, and data signals that, when grouped, may form test bench transactions capable of prompting operation of the circuit design 302 during simulation. In some embodiments, the test bench 304 can be written in an object-oriented programming language, for example, SystemVerilog or the like. A methodology library, for example, a Universal Verification Methodology (UVM) library, an Open Verification Methodology (OVM) library, an Advanced Verification Methodology (AVM) library, a Verification Methodology Manual (VMM) library, or the like, can be utilized as a base for creating the test bench 304 and simulating the circuit design 302. In some embodiments, the design verification tool 301 can receive the test bench 304 from a source external to the design verification tool 301, such as a user interface of the computer network 101, another tool implemented by the computer network 101, or the design verification tool 301 may generate the test bench 304 internally.

The circuit simulation unit 303 can include a simulation results unit 305 to record output created by the circuit design 302 during simulation with the test bench 304. The simulated output can include waveform data 308, simulation results in other formats, or the like. The circuit simulation unit 303 can include a simulation log unit 306 to record operations of or messages generated by the test bench 304 during simulation into a simulation log file 309. In some embodiments, the simulation log unit 306 can utilize default logging classes in at least one of the methodology libraries to capture the operations of or messages generated by the test bench 304 during simulation and record them in the simulation log file 309 in a predefined format.

The design verification tool 301 can include a functional verification unit 307 to compare the waveform data 308 with an expected output from the circuit design 302 in response the test bench 304. The functional verification unit 307 can verify the functionality of the circuit design 302 when the waveform data 308 indicates the circuit design 302 operates as expected based on the comparison. When the waveform data 308 indicates the circuit design 302 operates differently than expected based on the comparison, the functional verification unit 307 can determine a "bug" or other defect is present in the circuit design 302 and/or in the test bench 304. Although FIG. 3 shows the design verification tool 301 including the functional verification unit 307, in some embodiments, the functional verification unit 307 can be located external to the design verification tool 301.

When the functional verification unit 307 determines a "bug" or other defect is present in the circuit design 302 or in the test bench 304, designer(s) can utilize a debug tool 311 to isolate the "bug" in the circuit design 302 and/or test bench 304. The debug tool 311 can receive the circuit design 302, the test bench 304, the waveform data 308, and the simulation log file 309, for example, from the design verification tool 301.

The debug tool 311 can include a display unit 312 to prompt display or presentation of one or more debug windows capable of population with the waveform data 308, test bench transactions from the simulation log file 309, the circuit design 302, and/or the test bench 304. For example, the display unit 312 can prompt presentation of the waveform data 308 alongside the source code of the circuit design 302, which can allow the designer(s) to review the waveform data 308 and the circuit design 302 to isolate the "bug" identified by the functional verification unit 307. The display unit 312 also can prompt presentation of the test bench transactions during the debug process, for example, to allow the designer(s) to isolate the "bug" in the test bench 304. In some embodiments, the debug tool 311 can synchronize the waveform data 308, test bench transactions from the simulation log file 309, the circuit design 302, and/or the test bench 304 with each other, the display unit 312 can prompt presentation of the test bench transactions alongside and synchronized with the waveform data 308 and/or the test bench 304 in one or more debug windows. Embodiments of various debug windows will be described below in FIGS. 6A, 6B, 7, and 8.

The display unit 312 can include a biometric marker unit 313 to store one or more biometric markers 317, for example, received from a user interface of the computer network 101. The biometric markers 317 can include one or more search values, which can be utilized to match values in the waveform data 308, test bench transactions from the simulation log file 309, the circuit design 302, and/or the test bench 304.

When the display unit 312 identifies data to be presented, such as the waveform data 308, test bench transactions from the simulation log file 309, the circuit design 302, and/or the test bench 304, the biometric marker unit 313 can perform a search of the data to determine whether the data includes instances of search values in the biometric markers 317. In some embodiments, the biometric markers 317 can define search parameters utilized to determine whether the search values in the biometric markers 317 match any values in the waveform data 308, test bench transactions from the simulation log file 309, the circuit design 302, and/or the test bench 304. The search parameters can identify one or more representations for the search value to be matched, such as represented in decimal format, hexadecimal format, octal format, binary format, or the like. For example, when one of the biometric markers 317 include a search value specified in one format, the search parameters could indicate that in addition the a search for a value in the same format, the biometric marker unit 313 can search for the value in one or more different formats. The search parameters also can identify whether to utilize regular expression matching during the search. For example, the biometric marker unit 313 can search for a value specified by the biometric marker 317 that constitutes a portion of one or more of the searched values based one the search parameters indicating to search with regular expression matching.

The display unit 312 can include an accentuation unit 314 to prompt accentuation of values in one or more debug windows that the biometric marker unit 313 matched to search values in the biometric markers 317. In some embodiments, the accentuation unit 314 can indicate to the display unit 312, how to accentuate the matched values, and the display unit 312 can prompt presentation of the matched values along with accentuation instructions for the matched values. In other embodiments, the accentuation unit 314 can prompt presentation the matched values with an accentuation relative to other data presented in a debug window. When the display unit 312 presents multiple debug windows, which may be temporally synchronized with each other, the accentuation unit 314 can accentuate matched values in each the multiple debug windows. This accentuation of values that the biometric marker unit 313 matched to search values in the biometric markers 317 across multiple synchronized debug windows can allow designers the ability to review and/or track the matched values in various portions of the simulation.

The biometric markers 317 can include one or more display operations for the accentuation unit 314 and/or the display unit 312 to utilize, for example, when a search value in the biometric marker 317 matches one or more values in the waveform data 308, test bench transactions from the simulation log file 309, the circuit design 302, and/or the test bench 304. In some embodiments, the matched values can be displayed with a different color, different font, different font size, different font style, different outline sizing, different outline color, added underlining, added underscoring, or any other difference visibly perceptible when compared to other values in the presented data. Embodiments for marker-based value accentuation will be described below in greater detail.

Figure 4:
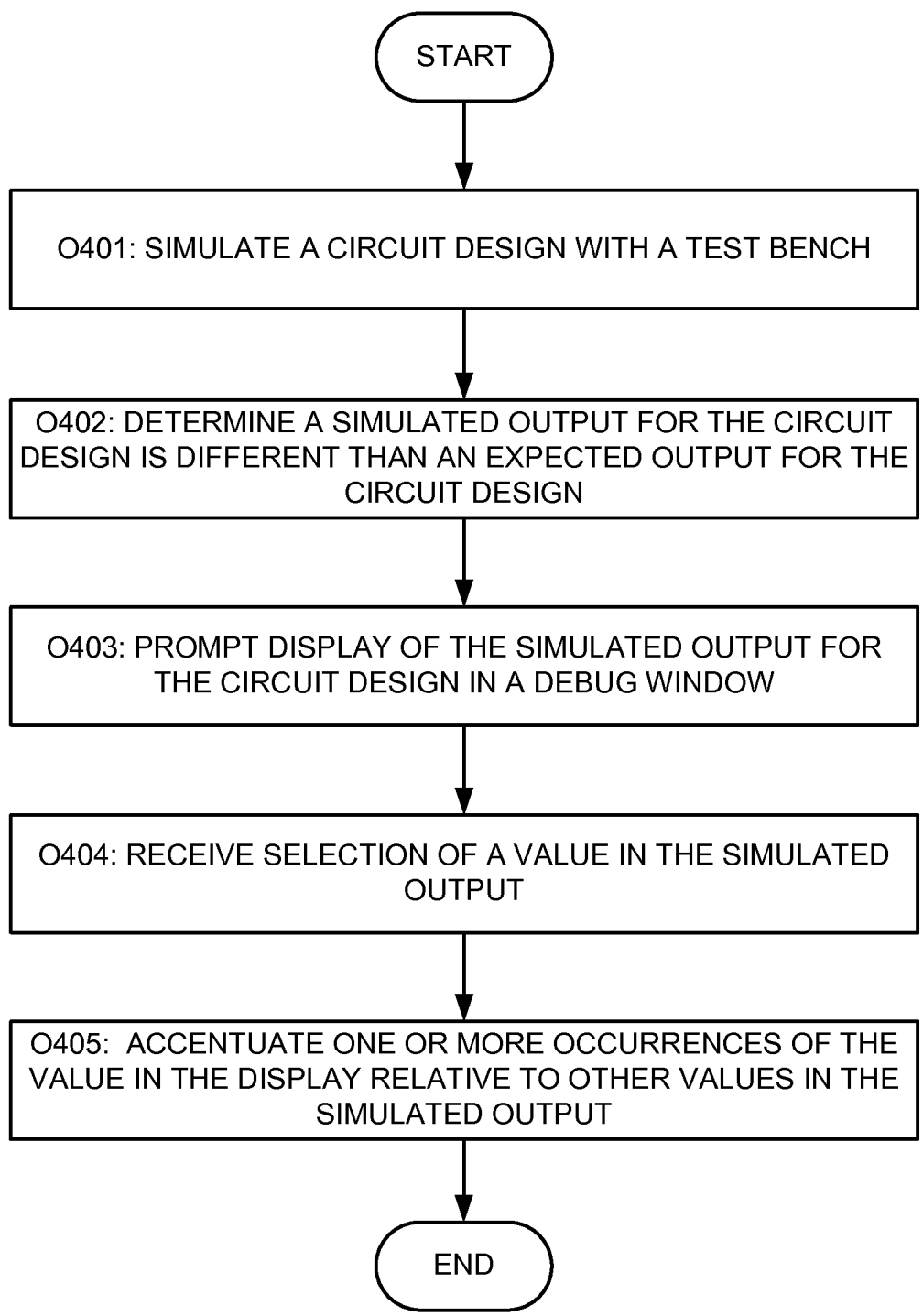
FIG. 4 illustrates a flowchart showing an example implementation of marker-based value accentuation according to various examples of the invention.

FIG. 4 illustrates a flowchart showing an example implementation of marker-based value accentuation according to various examples of the invention. Referring to FIG. 4, in block 401, a design verification tool can simulate a circuit design with a test bench. The design verification tool can record output created by the circuit design during simulation with the test bench, called waveform data or simulation results. The design verification tool also can record operation of the test bench during simulation into a simulation log file. In some embodiments, the design verification tool can utilize default logging classes in at least one of the methodology libraries to capture the operations of or messages generated by the test bench during simulation and record them in the simulation log file in a predefined format.

In a block 402, the design verification tool can determine whether a simulated output for the circuit design is different than an expected output for the circuit design. The design verification tool can verify the functionality of the circuit design when the waveform data indicates the circuit design operates as expected. When the waveform data indicates the circuit design operates differently than expected, the design verification tool can determine a "bug" or other defect is present in the circuit design or in the test bench.

In a block 403, the debug tool can prompt display the simulated output for the circuit design in a debug window, for example, in response to the determination that the "bug" or other defect is present in the circuit design or in the test bench. In some embodiments, the debug tool can prompt display of test bench transactions from a simulation log file, the circuit design, and/or the test bench in the debug window. The debug tool can selectively prompt display of different signals in the simulated output, different test bench transactions from a simulation log file, portions of the circuit design, and/or portions of the test bench in the debug window.

In a block 404, the debug tool can receive selection of a value in the simulated output, for example, from a user interface of the computer network 101. The selection of the value can prompt generation of a biometric marker corresponding to the selected value. In some embodiments, the debug tool can generate a biometric marker in response to the selection of the value.

The debug tool can search the simulated output displayed in the debug window to identify the instances of the simulated output that include the selected value in the biometric marker. In some embodiments, the biometric markers can define search parameters utilized to determine whether the selected value in the biometric marker matches any values in the waveform data, test bench transactions from the simulation log file, the circuit design, and/or the test bench. The search parameters can identify one or more representations for the selected value to be matched, such as represented in decimal format, hexadecimal format, octal format, binary format, or the like. The search parameters also can identify whether to utilize regular expression matching during the search. The debug tool can receive selection of the search parameters corresponding to the selected value in the simulated output, for example, from a user interface of the computer network 101.

In a block 405, the debug tool can accentuate one or more occurrences of the value in the display relative to other values in the simulated output. For example, the debug tool can accentuate the occurrences of the value in the display by prompting display of the values with a different color, different font, different font size, different font style, different outline sizing, different outline color, added underlining, added underscoring, or any other difference visibly perceptible when compared to other values in the display. In some embodiments, the biometric marker can include one or more display operations defining a type of accentuation for the debug tool to utilize to accentuate occurrences of the value in the display. The debug tool can receive selection of the display operations corresponding to the selected value in the simulated output, for example, from a user interface of the computer network 101.

Although FIG. 4 shows non-accentuated display of simulated output prior to value selection and accentuation, in some embodiments, the debug window can have a biometric marker specified prior to display of all or at least some of the simulated output. In this case, the debug tool, in the block 403, can prompt display of the simulated output with value accentuation based on the biometric marker specified prior to display of all or at least some of the simulated output.

Figure 5:
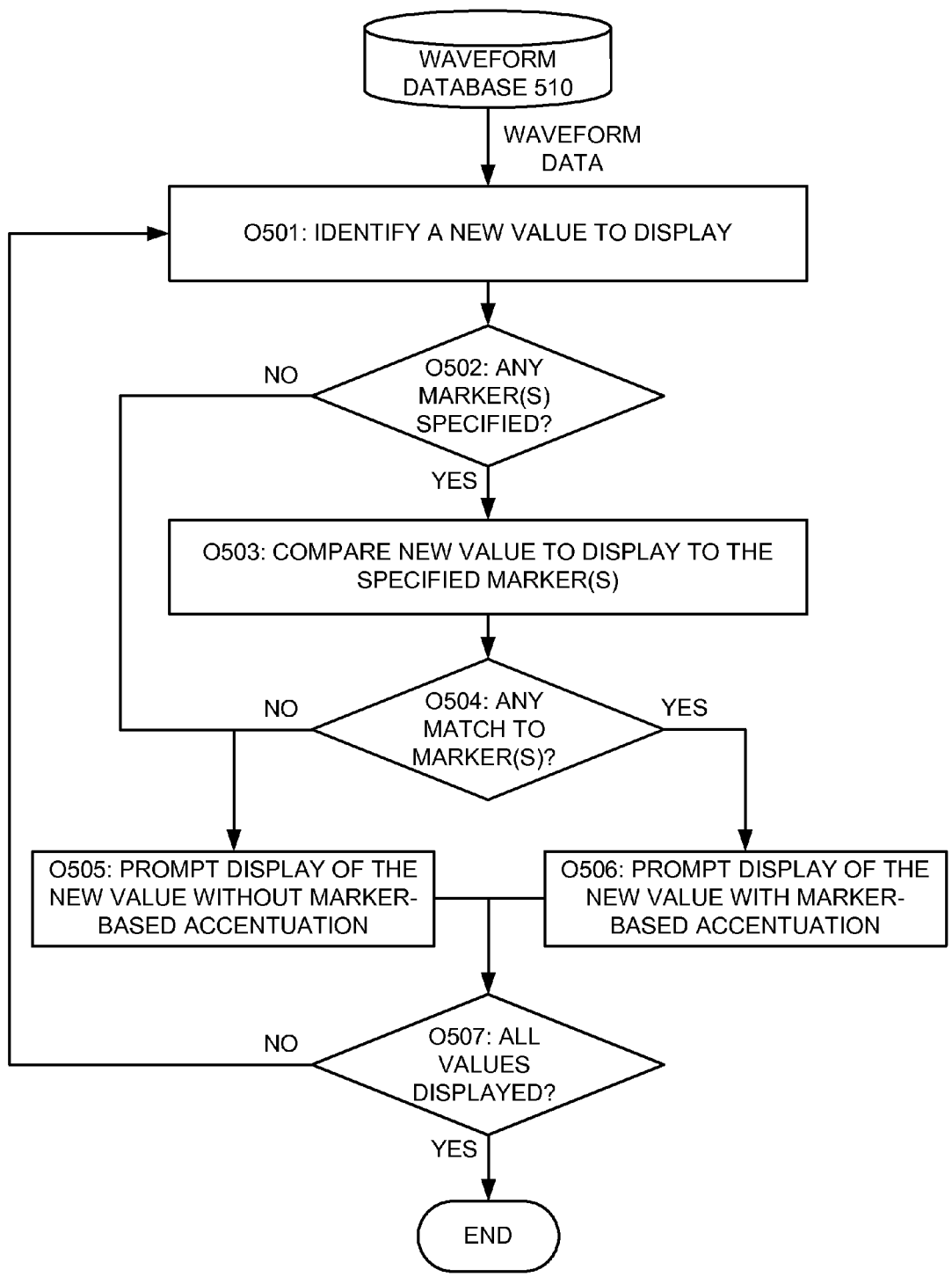
FIG. 5 illustrates a flowchart showing an example implementation of display of waveform data using marker comparison and selective value accentuation according to various examples of the invention.

FIG. 5 illustrates a flowchart showing an example implementation of display of waveform data using marker comparison and selective value accentuation according to various examples of the invention. Referring to FIG. 5, in block 501, a debug tool can identify a new value of waveform data to display. In some embodiments, the new value can be a value in a test bench, a value in a simulation log, a value in a circuit design, or the like. The debug tool can identify the new value to display in response to input from a user interface in computer network 101, in response to a new biometric marker being specified for the debug environment, in response selection of new data to display in the debug window, or the like.

In a block 502, the debug tool can determine whether any biometric markers have been specified in the debug environment, or any particular debug window in the debug environment. When a biometric marker has not been specified for the debug window, in block 505, the debug tool can prompt display of the new value without marker-based accentuation.

When a biometric marker has been specified in the debug environment, in block 503, the debug tool can compare the new value to display to the specified biometric marker. For example, the biometric marker can include a value, which can be compared to the new value to display. In some embodiments, the biometric marker can define search parameters utilized to determine whether the value in the biometric marker matches the new value. The search parameters can identify one or more representations for the value in the biometric marker, such as represented in decimal format, hexadecimal format, octal format, binary format, or the like. The search parameters also can identify whether to utilize regular expression matching during the comparison.

In a block 504, the debug tool can determine whether the new value matches any biometric markers. The debug tool can utilize the comparison of the new value with the biometric markers specified in the debug environment to determine whether the new value matches one or more of the biometric markers. When the new value does not match any biometric markers specified in the debug environment, in block 505, the debug tool can prompt display of the new value without marker-based accentuation.

When the new value matches at least one biometric marker specified in the debug environment, in block 506, the debug tool can prompt display of the new value with marker-based accentuation. For example, the debug tool can accentuate the new value in the debug window by prompting display of the new value with a different color, different font, different font size, different font style, different outline sizing, different outline color, added underlining, added underscoring, or any other difference visibly perceptible when compared to other values in the display. In some embodiments, the biometric marker can include one or more display operations that the debug tool can utilize to accentuate occurrences of the value in the display.

In a block 507, the debug tool can determine whether all values have been displayed. When there is a new value to display, execution can return to block 501. When all values have been displayed, execution can end.

Figure 6A:
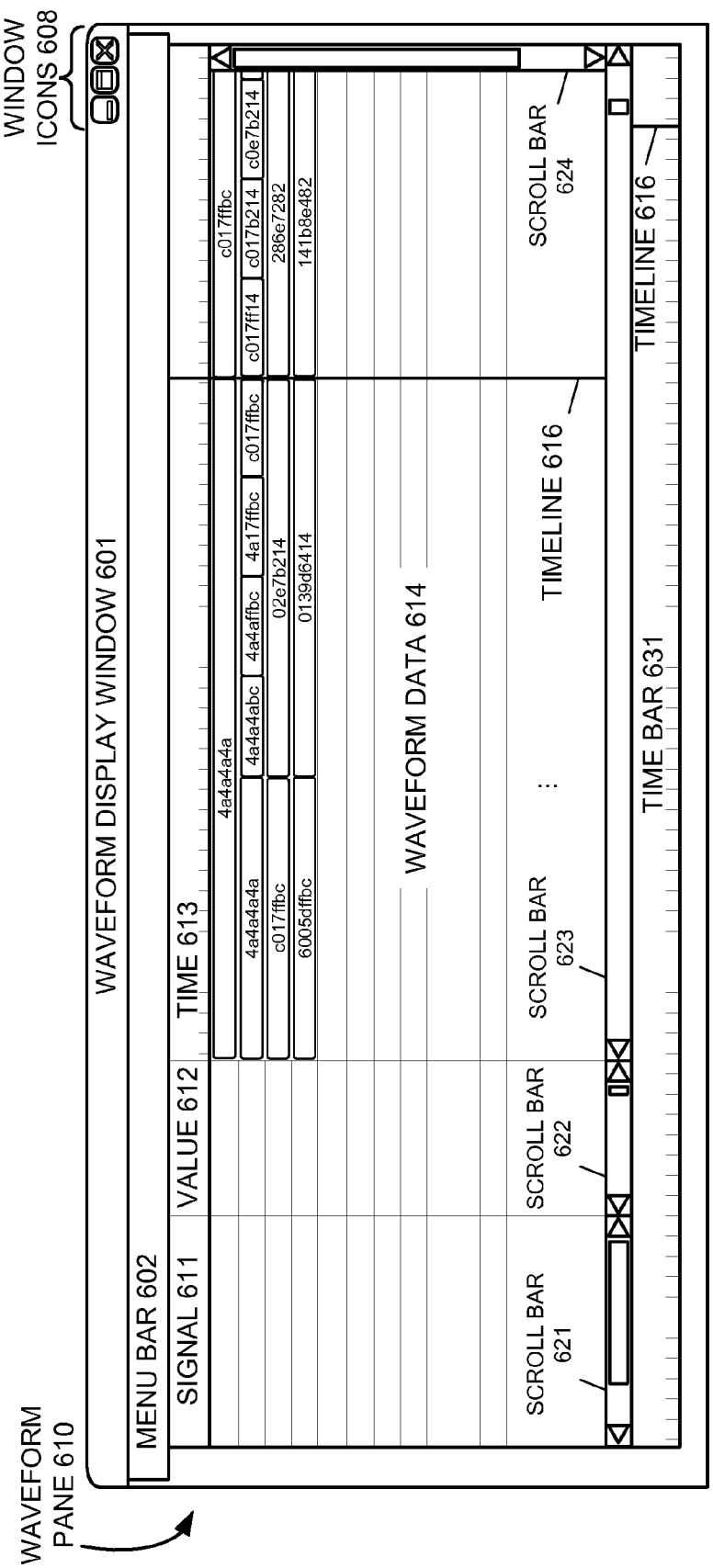
FIGS. 6A and 6B illustrate an example waveform display window 601 according to various embodiments of the invention.
Figure 6B:
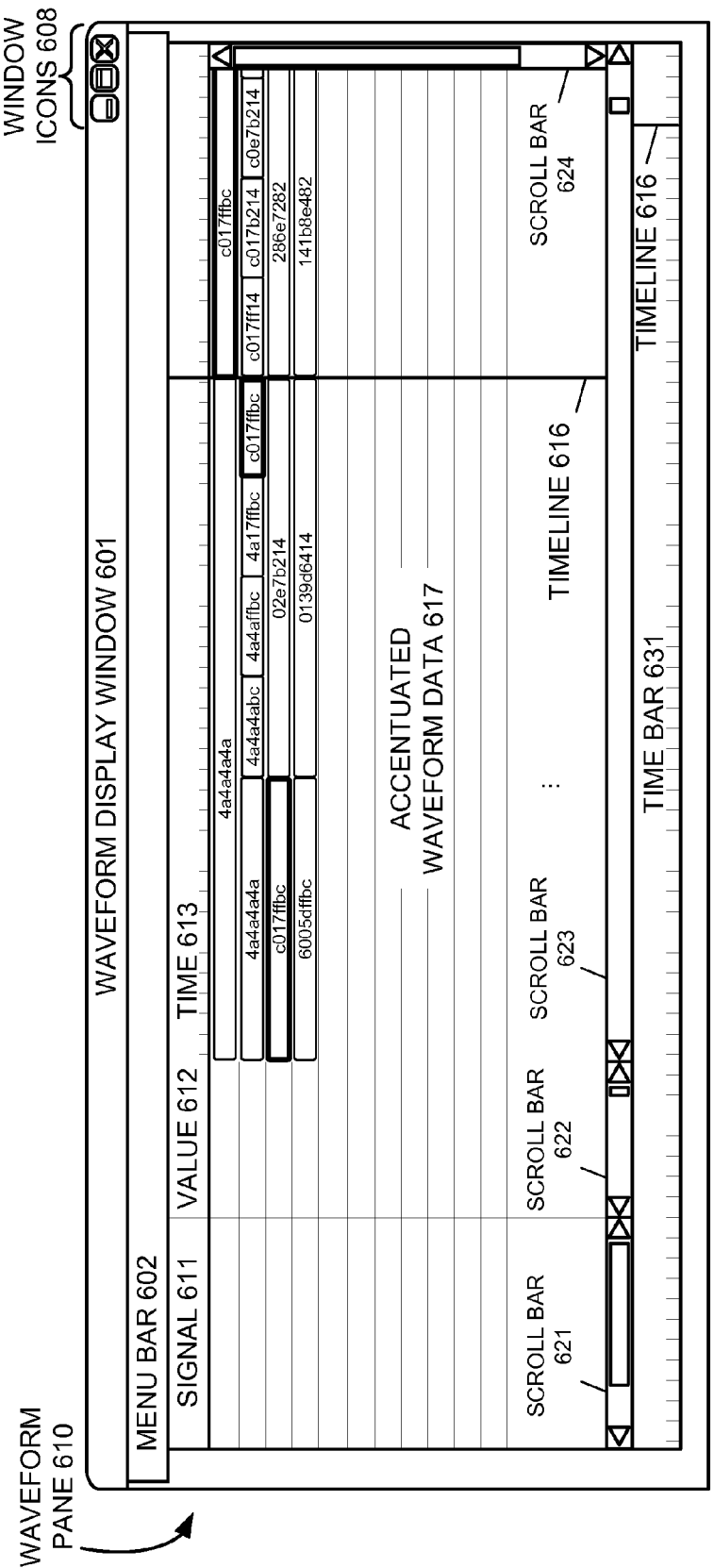

FIGS. 6A and 6B illustrate an example waveform display window 601 according to various embodiments of the invention. Referring to FIG. 6A, the waveform display window 601 can include a waveform pane 610 to include a list of waveform data 614, which can correspond to output from a circuit design simulated with a test bench. In some embodiments, the waveform pane 610 can be arranged in a row-column format, with the rows corresponding to different signal waveforms in the waveform data 614 and the columns including various attributes of the waveform data 614. For example, the waveform pane 610 can include a signal 611 column, which can indicate a particular signal waveform in the waveform data 614. The waveform pane 610 can include a value 612 column, which can indicate a value of partial (leftmost) signal waveform in the waveform data 614.

The waveform pane 610 can include a time 613 column, which can include the waveform data 614 synchronized based on generation time during simulation of the circuit design with the test bench, also called a simulation time. The waveform pane 610 can include scroll bars 621-624, that, when selected or moved, for example, in response to user input, can adjust which portions of the signal 611, the value 612, the time 613 columns are viewable in the waveform pane 610.

The waveform display window 601 can include a time bar 631 having listing of simulation times, and the time 613 column can include listing having a subset of the simulation times in the time bar 631. The waveform pane 610 can include a timeline 616 to indicate which simulation time is presented in the time 613 column. In some embodiments, the timeline 616 can be displayed vertically in the time bar 631 crossing a currently selected simulation time, and displayed vertically in the time 613 column crossing a currently selected simulation time in the time 613 column and optionally the waveform data 614.

The waveform display window 601 can include a menu bar 602 having various mechanisms to selectively sort, filter, organize, populate, or the like, the waveform pane 610 with the waveform data 614. The menu bar 602 can also allow selection of one or more values in the waveform data 614 to mark, for example, into a biometric marker. The menu bar 602 can provide various options for marking values in the waveform data 614, such as a type of accentuation to be utilized for the data, different techniques for matching the marked value to other values currently displayed in the waveform display window 601 or displayed in the future in the waveform display window 601. The waveform display window 601 also can include window icons 608, which can control sizing of the waveform display window 601, such as enlarging, shrinking, minimizing, or the like, and closing of the waveform display window 601.

Referring to FIG. 6B, the waveform display window 601 in FIG. 6B is similar to the waveform display window 601 in FIG. 6A, except the waveform pane 610 in FIG. 6B includes accentuated waveform data 617 rather than waveform data 614 that was not accentuated in FIG. 6A. For example, portions of waveform data having a value c017ffbc in the accentuated waveform data 617 include a different outline, which emphasizes those portions of waveform data having the value c017ffbc relative to the other values in the accentuated waveform data 617. The accentuation of the portions of waveform data having the value c017ffbc can indicate that the waveform display window 601 can have a biometric marker for the value c017ffbc, that a debug tool matched the portions of waveform data having the value c017ffbc to the biometric marker, and accentuated the matched portions of the waveform data, for example, based on display parameters in the biometric marker.

Although FIG. 6B shows the waveform display window 601 accentuating the portions of waveform data having the value c017ffbc with a different outline, in some embodiments, the portions of waveform data having the value c017ffbc can be accentuated in any number of different ways, such as with a different color, different font, different font size, different font style, different outline sizing, different outline color, added underlining, added underscoring, or any other difference visibly perceptible when compared to other portions of waveform data.

Figure 7:
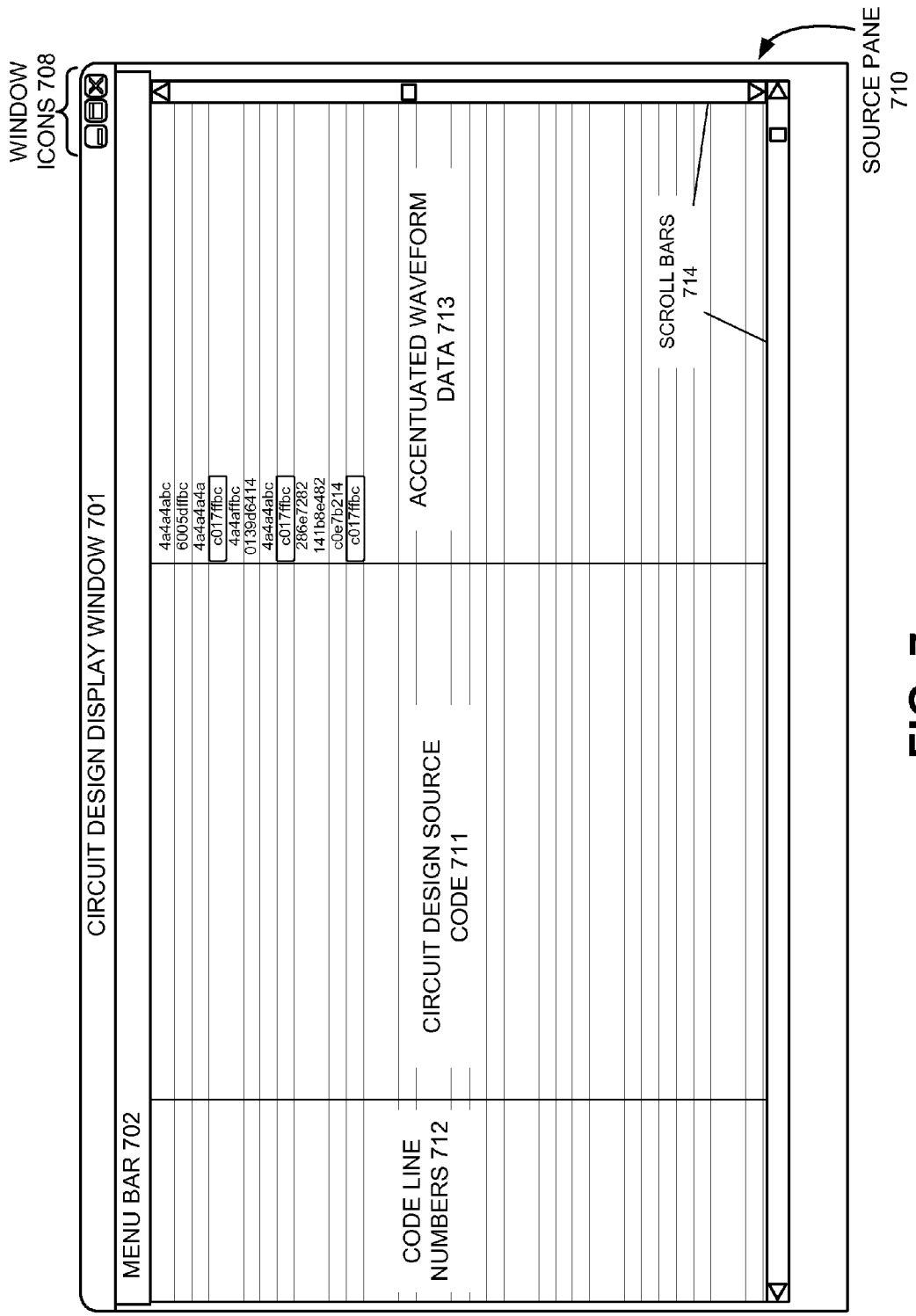
FIG. 7 illustrates an example circuit design display window with marker-based value accentuation according to various embodiments of the invention.

FIG. 7 illustrates an example circuit design display window 701 with marker-based value accentuation according to various embodiments of the invention. Referring to FIG. 7, the circuit design display window 701 can include a source pane 710 having a circuit design source code 711, for example, sequenced by code line numbers 712. In some embodiments, the source pane 710 can be arranged in rows, with each row corresponding to different line in the circuit design source code 711. The source pane 710 can include scroll bars 714, that, when selected or moved, for example, in response to user input, can adjust which portions of the circuit design display window 701 are viewable in the source pane 710.

The source pane 710 also can include accentuated waveform data 713, for example, in the rows corresponding to portions of the circuit design source code 711. For example, portions of waveform data having a value c017ffbc in the accentuated waveform data 713 includes an outline, which emphasizes those portions of waveform data having the value c017ffbc relative to the other values in the accentuated waveform data 713. The accentuation of the portions of waveform data having the value c017ffbc can indicate that the circuit design display window 701 can have a biometric marker for the value c017ffbc, that a debug tool matched the portions of waveform data having the value c017ffbc to the biometric marker, and accentuated the matched portions of the waveform data, for example, based on display parameters in the biometric marker.

Although FIG. 7 shows the circuit design display window 701 accentuating the portions of waveform data having the value c017ffbc with the outline, in some embodiments, the portions of waveform data having the value c017ffbc can be accentuated in any number of different ways, such as with a different color, different font, different font size, different font style, different outline sizing, different outline color, added underlining, added underscoring, or any other difference visibly perceptible when compared to other portions of waveform data. The circuit design display window 701 can include a menu bar 702, window icons 708, and scroll bars 714, which can be similar to menu bar 602, window icons 608, and scroll bars 621-624 discussed above with reference to FIGS. 6A and 6B.

Figure 8:
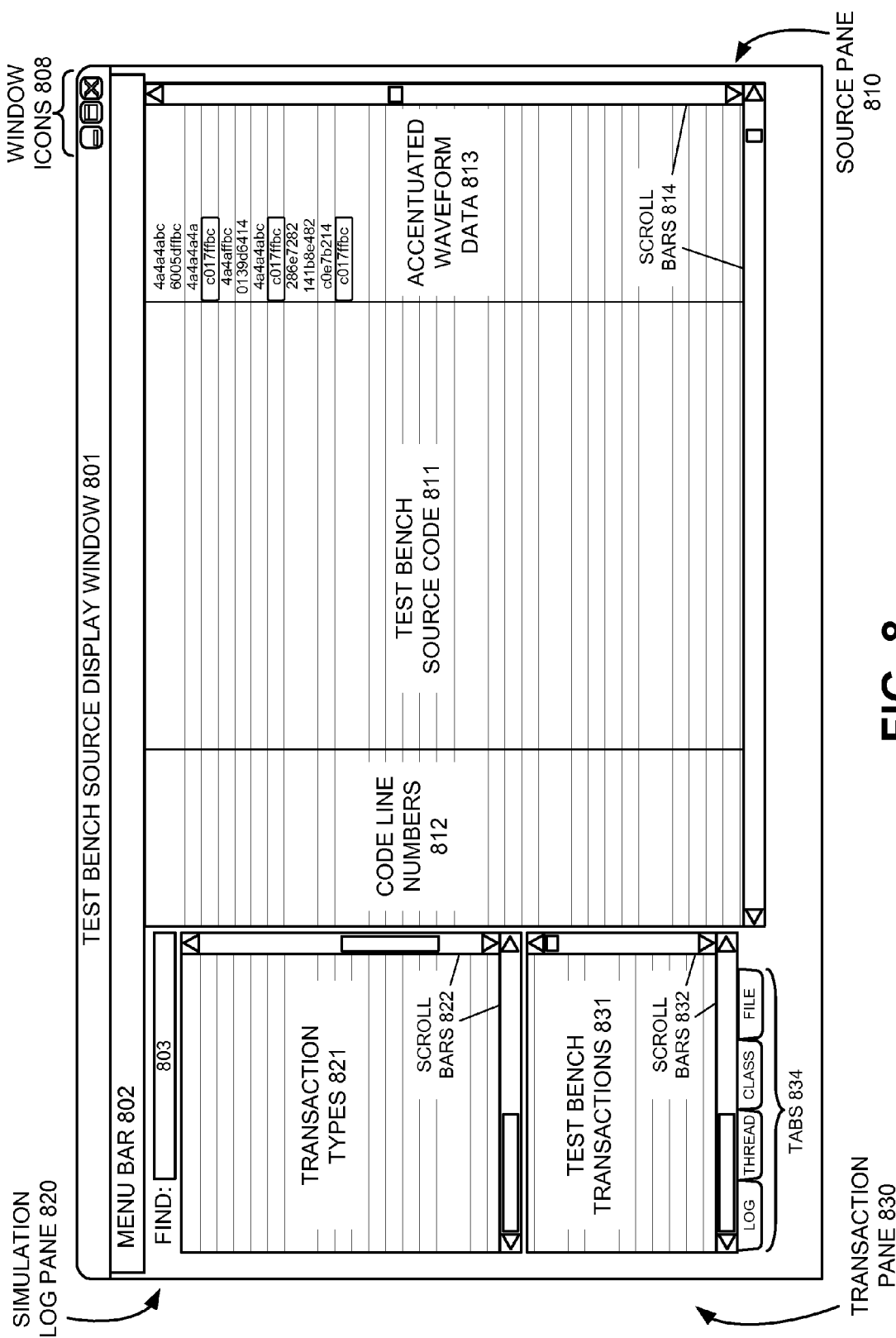
FIG. 8 illustrates an example test bench source display window with marker-based value accentuation according to various embodiments of the invention.

FIG. 8 illustrates an example test bench source display window with marker-based value accentuation according to various embodiments of the invention. Referring to FIG. 8, the test bench source window 801 can include a source pane 810, a simulation pane 820, and a transaction pane 830. The source pane 810 can include a test bench source code 811, for example, sequenced by code line numbers 812. In some embodiments, the source pane 810 can be arranged in rows, with each row corresponding to different line in the test bench source code 811. The source pane 810 can include scroll bars 814, that, when selected or moved, for example, in response to user input, can adjust which portions of the test bench source code 811 are viewable in the source pane 810.

The source pane 810 also can include accentuated waveform data 813, for example, in the rows corresponding to portions of the test bench source code 811. For example, portions of waveform data having a value c017ffbc in the accentuated waveform data 813 includes an outline, which emphasizes those portions of waveform data having the value c017ffbc relative to the other values in the accentuated waveform data 813. The accentuation of the portions of waveform data having the value c017ffbc can indicate that the test bench source display window 801 can have a biometric marker for the value c017ffbc, that a debug tool matched the portions of waveform data having the value c017ffbc to the biometric marker, and accentuated the matched portions of the waveform data, for example, based on display parameters in the biometric marker.

Although FIG. 8 shows the test bench source display window 801 accentuating the portions of waveform data having the value c017ffbc with the outline, in some embodiments, the portions of waveform data having the value c017ffbc can be accentuated in any number of different ways, such as with a different color, different font, different font size, different font style, different outline sizing, different outline color, added underlining, added underscoring, or any other difference visibly perceptible when compared to other portions of waveform data.

The simulation pane 820 can include information regarding types of transactions 821 in a simulation log file, such as different transactions extracted from the simulation log file, for example, arranged by their corresponding transaction scope or type. In some embodiments, the simulation pane 820 can be arranged in rows, with each row corresponding to different type of transaction in the simulation log file. The simulation pane 820 can include scroll bars 822, which, when selected or moved, for example, in response to user input, can adjust which transaction types 821 are viewable in the simulation pane 820.

The transaction pane 830 can include test bench transactions 831. In some embodiments, the transaction pane 830 can be arranged in rows, with each row corresponding to different transaction extracted from the simulation log file. The transaction pane 830 can include tabs 834, such as a log tab, thread tab, class tab, file tab, or the like, which can select a format for viewing the test bench transactions 831, and for the transaction types 821 in the simulation log pane 820. The transaction pane 830 can include scroll bars 832, that, when selected or moved, for example, in response to user input, can adjust which portions of the test bench transactions 831 are viewable in the transaction pane 830.

The source pane 810, the simulation pane 820, and the transaction pane 830 can be interrelated, with a selection of a row in one pane causing corresponding portions of the other panes to automatically scroll into view and optionally be highlighted or otherwise have their presentation altered to annunciate their presence in the corresponding panes. For example, a selection of a test bench transaction 831 in the transaction pane 830 can cause a transaction type 821 in the simulation pane 820 and a section of the test bench source code 811 to automatically scroll into view and optionally be highlighted or otherwise have their presentation altered to annunciate their presence.

The test bench source display window 801 can include a menu bar 802 having various mechanisms to selectively sort, filter, organize, populate, or the like, the source pane 810, the simulation pane 820, and the transaction pane 830. The test bench source display window 801 also can include window icons 808, which can control sizing of the test bench source display window 801, such as enlarging, shrinking, minimizing, or the like, and closing of the test bench source display window 801.

Although FIG. 6A-8 show display of data including waveform data, test bench transactions from a simulation log file, a circuit design source code, and a test bench source code in different display windows, this data can be presented in any number of windows or have the data included one window. Further, any additional data can be added to or any current data can be removed from any of the window or windows described above.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

Conclusion

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
    displaying, by a computing system in a debug window, waveform data output from a simulated circuit design;
    identifying, by the computing system, a marker defining a search value has been specified for a debug environment; and
    matching, by the computing system, the search value defined by the marker to one or more portions of the waveform data, wherein displaying the waveform data comprises accentuating, the one or more matched portions of the waveform data relative to other portions of the waveform data displayed in the debug window.

2. The method of claim 1, wherein accentuating the one or more matched portions of the waveform data is performed when the search value defined by the marker matches at least a portion of a hexadecimal representation of a value in the waveform data, a decimal representation of the value, a binary representation of the value, or an octal representation of the value.

3. The method of claim 1, wherein matching the search value defined by the marker to one or more portions of the waveform data further comprises utilizing regular expression matching to determine whether the search value defined by the marker is located within one or more values of the waveform data.

4. The method of claim 1, further comprising:
    receiving, by the computing system, a selection of a value in the waveform data after displaying the waveform data for the circuit design in the debug window; and
    utilizing, by the computing system, the selected value in the waveform data as the search value defined by the marker.

5. The method of claim 1, further comprising:
    displaying, by the computing system, at least a portion of the waveform data for the circuit design in a different debug window; and
    accentuating, by the computing system, one or more occurrences of the search value in the different debug window relative to other values in the waveform data based, at least in part, on the marker specified for the debug environment.

6. The method of claim 5, wherein the debug window and the different debug window are temporally synchronized with each other.

7. A system comprising:
    a display device configured to display waveform data output from a simulated circuit design in a debug window; and
    a debug tool configured to identify a marker defining a search value has been specified for a debug environment, and wherein the debug tool is configured to match the search value defined by the marker to one or more portions of the waveform data and to accentuate the one or more matched portions of the waveform data relative to other portions of the waveform data displayed in the debug window.

8. The system of claim 7, wherein the debug tool is configured to accentuate the one or more matched portions of the waveform data by prompting the display device to alter a presentation of the waveform data in the debug window.

9. The system of claim 7, wherein the debug tool is configured to receive a selection of a value in the waveform data after the display device displays the waveform data for the circuit design in the debug window, and to utilize the selected value in the waveform data as the search value defined by the marker.

10. The system of claim 7, wherein the debug tool is configured to display the waveform data in the debug window when the waveform data is different than an expected output for the simulated circuit design.

11. The system of claim 7, wherein the debug tool is configured to prompt display at least a portion of the waveform data for the circuit design in a different debug window, and accentuate one or more occurrences of the search value in the different debug window relative to other values in the waveform data based, at least in part, on the marker specified for the debug environment.

12. An apparatus comprising at least one computer-readable memory device storing instructions configured to cause one or more processing devices to perform operations comprising:
   prompting display of waveform data output from a simulated circuit design in a debug window;
   identifying a defining a search value has been specified for a debug environment; and
   matching the search value defined by the marker to one or more portions of the waveform data, wherein prompting display of the waveform data comprises prompting accentuation of the one or more matched portions of the waveform data relative to other portions of the waveform data displayed in the debug window.

13. The apparatus of claim 12, wherein the instructions are configured to cause one or more processing devices to perform operations further comprising prompting alteration of a presentation of the matched portions of the waveform data.

14. The apparatus of claim 12, wherein the debug window is configured to display the waveform data and other simulation data including at least one of a circuit design source code, a test bench source code, or a simulation log file including operations of the test bench source code during simulation.

15. The apparatus of claim 14, wherein the instructions are configured to cause one or more processing devices to perform operations further comprising temporally synchronizing the waveform data with the other simulation data.

16. The apparatus of claim 12, wherein the instructions are configured to cause one or more processing devices to perform operations further comprising determining a selection of the marker corresponding to the value in the simulated output was received after displaying the simulated output for the circuit design in the debug window.

17. The apparatus of claim 12, wherein the instructions are configured to cause one or more processing devices to perform operations further comprising:
   displaying at least a portion of the waveform data for the circuit design in a different debug window; and
   accentuating one or more occurrences of the search value in the different debug window relative to other values in the waveform data based, at least in part, on the marker specified for the debug environment.

* * * * *